United States Patent
Chang

(10) Patent No.: US 7,528,753 B2
(45) Date of Patent: May 5, 2009

(54) CODEC SIMULTANEOUSLY PROCESSING MULTIPLE ANALOG SIGNALS WITH ONLY ONE ANALOG-TO-DIGITAL CONVERTER AND METHOD THEREOF

(75) Inventor: Cheng-Chih Chang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 11/775,277

(22) Filed: Jul. 10, 2007

(65) Prior Publication Data
US 2008/0062028 A1    Mar. 13, 2008

(30) Foreign Application Priority Data
Sep. 8, 2006    (TW) .............................. 95133187 A

(51) Int. Cl.
*H03M 1/00*    (2006.01)
(52) U.S. Cl. ........................ 341/141; 341/155; 341/156
(58) Field of Classification Search ................. 341/141, 341/155, 156; 455/550, 427, 553.1
See application file for complete search history.

(56) References Cited
U.S. PATENT DOCUMENTS

| | | | | |
|---|---|---|---|---|
| 3,631,462 A | * | 12/1971 | Dym | ........................... 341/118 |
| 4,233,627 A | * | 11/1980 | Sugihara | ...................... 348/485 |
| 5,140,612 A | * | 8/1992 | Yoshikawa | ................... 375/212 |
| 5,444,736 A | * | 8/1995 | Kawashima et al. | ......... 375/219 |
| 5,550,893 A | * | 8/1996 | Heidari | ..................... 455/553.1 |
| 6,081,709 A | * | 6/2000 | Karabinis | .................... 455/427 |
| 6,487,174 B1 | * | 11/2002 | Mizuguchi et al. | ........... 370/252 |
| 6,751,474 B1 | * | 6/2004 | Lin et al. | ...................... 455/557 |
| 2002/0198017 A1 | * | 12/2002 | Babasaki et al. | ............. 455/550 |
| 2005/0025101 A1 | * | 2/2005 | Paneth et al. | ................. 370/336 |

* cited by examiner

*Primary Examiner*—Jean B Jeanglaude
(74) *Attorney, Agent, or Firm*—Thomas, Kayden, Horstemeyer & Risley

(57) ABSTRACT

A coder-decoder simultaneously processing a plurality of first analog signals with only one analog-to-digital converter is provided. In an exemplary embodiment, the coder-decoder comprises a multiple access modulator, the analog-to-digital converter, and a multiple access demodulator. The multiple access modulator combines the first analog signals according to a multiple access algorithm to obtain a first multiple access signal comprising the first analog signals. The analog-to-digital converter then converts the first multiple access signal from analog to digital to obtain a second multiple access signal. The multiple access demodulator then separates the second multiple access signal according to the multiple access algorithm to obtain a plurality of first digital signals respectively corresponding to the first analog signals.

20 Claims, 4 Drawing Sheets

CODEC SIMULTANEOUSLY PROCESSING MULTIPLE ANALOG SIGNALS WITH ONLY ONE ANALOG-TO-DIGITAL CONVERTER AND METHOD THEREOF

BACKGROUND OF THE INVENTION

1. Field of the Invention

The invention relates to signal processing, and more particularly to coder-decoders (CODEC).

2. Description of the Related Art

Coder-decoders are circuits converting signals between analog and digital forms. For example, after analog signals are converted to digital signals by coder-decoders, the digital signals can then be processed by digital processors of computers or other devices to generate audio or video samples. Conventional audio and video samples can be further compressed to reduce the transmission bandwidth thereof.

Multiple access is a modulation technique used in satellite and long-distance communication. A communication satellite or switching center can simultaneously service multiple satellite terminals or mobile connections via a single communication connection link with multiple access modulation. Because bandwidth of mobile communication systems is limited, the system only assigns bandwidth to clients when clients initiate a communication session and revokes assigned bandwidth for use of other clients when the communication session is over. Thus, the mobile communication system must dynamically allocate bandwidth, and multiple access modulation is suitable for mobile communication systems to reduce bandwidth resource requested by a single client. Current multiple access modulation methods include a Time Division Multiple Access (TDMA) method, a Frequency Division Multiple Access (FDMA) method, and a Code Division Multiple Access (CDMA) method.

FDMA slices a frequency band into multiple channels of equal bandwidth, each FDMA channel carrying data of a specific client. TDMA slices a transmission period into multiple time slots of equal length, each transmitting data of a specific client. CDMA modulates data of multiple clients with spreading codes to obtain a CDMA signal, and a CDMA receiver retrieves data of a specific client from the CDMA signal with the specific spreading code corresponding to the specific client. Thus, the bandwidth of a mobile communication system can be dynamically allocated to multiple clients simultaneously accessing the system.

A conventional codec requires an analog-to-digital converter for conversion of audio or video signals. If a codec has multiple audio inputs or video inputs, the codec requires multiple analog-to-digital converters accordingly. The multiple analog-to-digital converters occupy considerable chip area of a codec chip, increasing production costs. For example, two analog-to-digital converters can substantially occupy 40% area of a codec chip, complicating chip design and increasing production cost. If a codec handles multiple analog inputs with a single analog-to-digital converter, cost of the codec is effectively decreased.

BRIEF SUMMARY OF THE INVENTION

The invention provides a coder-decoder simultaneously processing a plurality of first analog signals with only one analog-to-digital converter. In an exemplary embodiment, the coder-decoder comprises a multiple access modulator, the analog-to-digital converter, and a multiple access demodulator. The multiple access modulator modulates the first analog signals according to a multiple access method to obtain a first multiple access signal comprising the first analog signals. The analog-to-digital converter then converts the first multiple access signal from analog to digital to obtain a second multiple access signal. The multiple access demodulator then demodulates the second multiple access signal according to the multiple method to obtain a plurality of first digital signals respectively corresponding to the first analog signals.

the invention also provides a method for simultaneously processing a plurality of analog signals with only one analog-to-digital converter. First, a plurality of first analog signals are modulated according to a multiple access method to obtain a first multiple access signal comprising the first analog signals. The first multiple access signal is then converted from analog to digital with the analog-to-digital converter to obtain a second multiple access signal. Finally, the second multiple access signal is demodulated according to the multiple access method to obtain a plurality of first digital signals respectively corresponding to the first analog signals.

A detailed description is given in the following embodiments with reference to The accompanying drawings.

BRIEF DESCRIPITON OF THE DRAWINGS

The invention can be more fully understood by reading the subsequent detailed description and examples with references made to the accompanying drawings, wherein.

Figure 3:
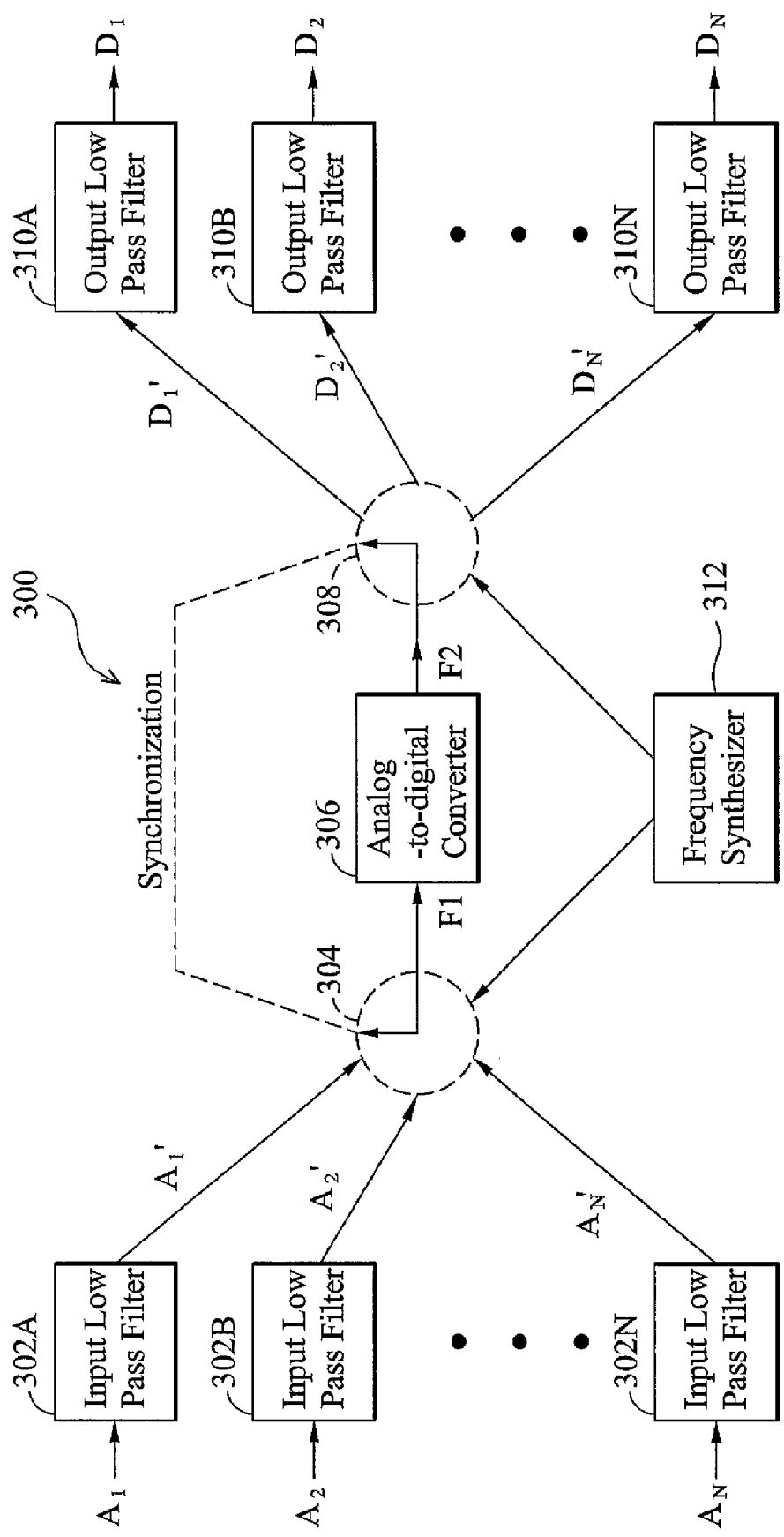
Figure 4:
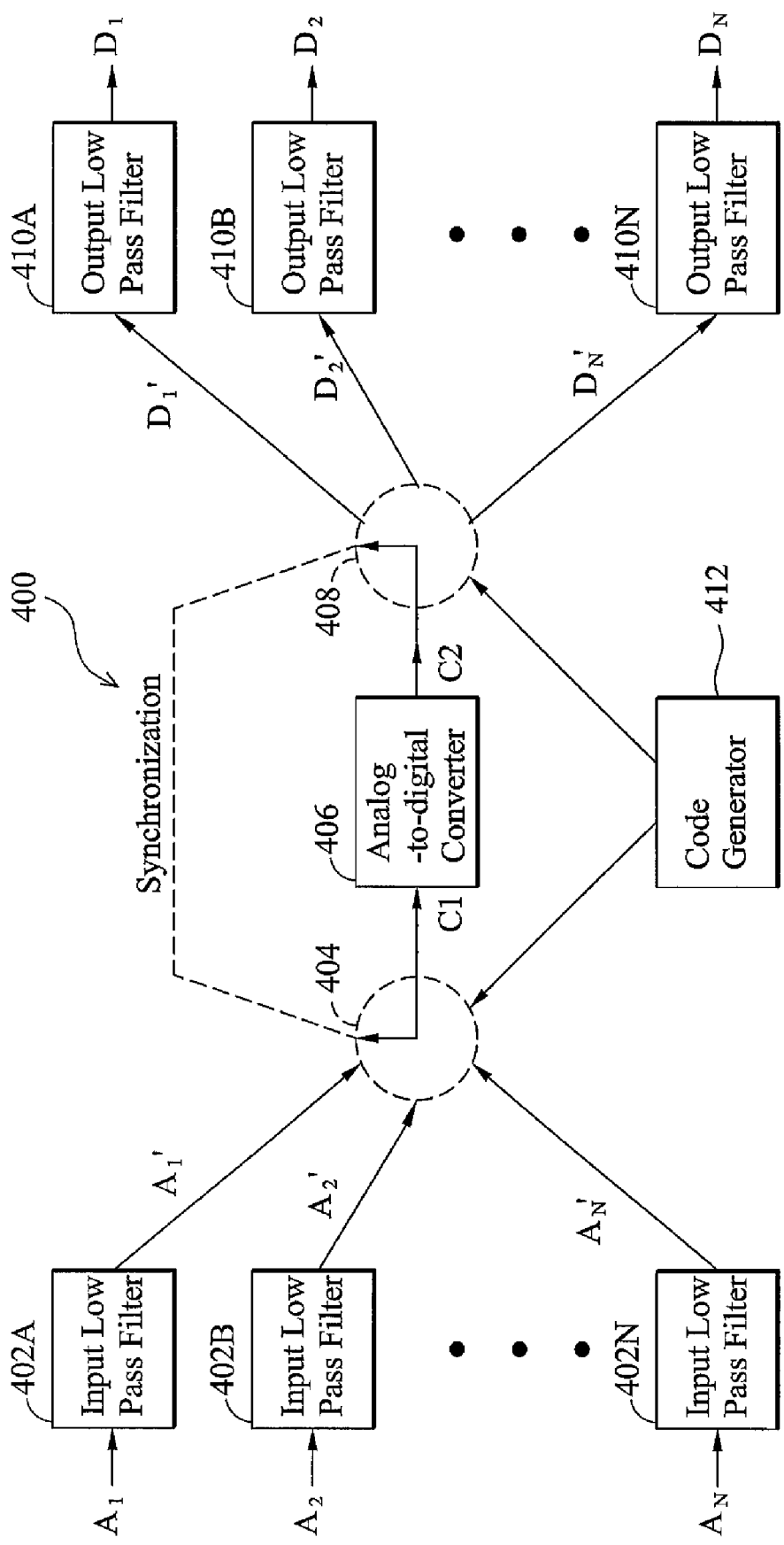

FIG. 3 is a block diagram of a portion of a codec according to the invention, wherein the codec simultaneously converts multiple input signals from analog to digital with an analog-to-digital converter according to a FDMA method; and FIG. 4 is a block diagram of a portion of a codec according to he invention, wherein the codec simultaneously converts multiple input signals from analog to digital with an analog-to-digital converter according to a CDMA method

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a multiple access method modulating multiple analog audio or video signals to obtain a single multiple access signal, and then converts the multiple access signal from analog to digital with a single analog-to-digital converter. The multiple access method can be a TDMA method, a FDMA method, or a CDMA method. Thus, the codec requires only one analog-to-digital converter. Because the number of analog-to-digital converters is decreased, the chip area occupied by the analog-to-digital converter in the codec chip is reduced, as is manufacture cost of the codec chip.

Figure 1:
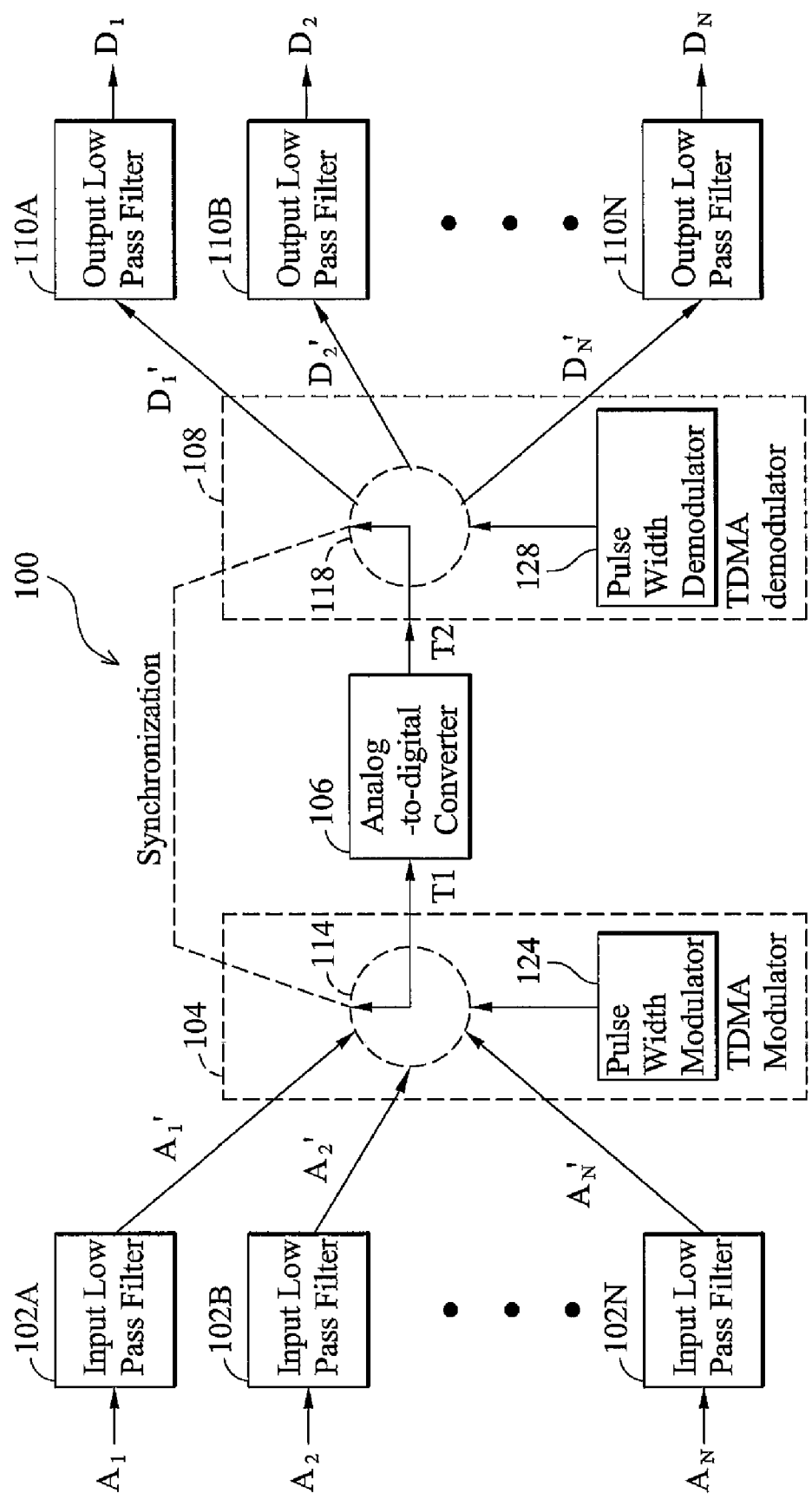
FIG. 1 is a block diagram of a portion of a codec according to the invention, wherein the codec simultaneously converts multiple input signals from analog to digital with an analog-to-digital converter according to a TDMA method.

FIG. 1 is a block diagram of a portion of a codec 100 according to the invention, wherein the codec 100 simultaneously converts multiple input signals from analog to digital with an analog-to-digital converter 106 according to a TDMA method. The codec 100 receives multiple analog input signals $A_1 \sim A_N$, and the codec 100 must convert analog input signals $A_1 \sim A_N$ from analog to digital before the input signals are further decoded. The input signals $A_1 \sim A_N$ may be analog audio signals, such as multi-channel audio signals, or analog video signals, such as three video inputs of RGB format.

Input low pass filters 102A~102N first respectively filter off high frequency noise from the analog input signals $A_1 \sim A_N$ to obtain analog input signals $A_1' \sim A_N'$, fitting the frequency band of the analog input signals $A_1' \sim A_N'$ to the range derived from the sampling rate of the analog-to-digital converter 106 according to Shannon-Nyquist sampling theorem and avoiding signal distortion due to inter-symbol interference. Thus, the input low pass filters 102A~102N are also referred to as "anti-alias filters". The filtered analog input signals $A_1' \sim A_N'$ are then delivered to a TDMA modulator 104. The TDMA modulator 104 modulates the analog input signals $A_1' \sim A_N'$ according to a TDMA method to an analog TDMA signal $T_1$.

Figure 2:
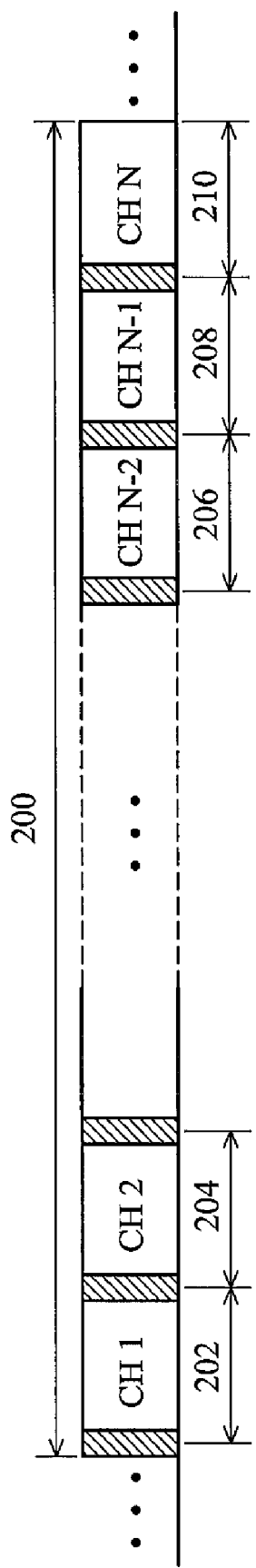
FIG. 2 is a schematic diagram of the TDMA signal shown in FIG. 1.

FIG. 2 is a schematic diagram of the TDMA signal $T_1$ shown in FIG. 1. If a TDMA system must simultaneously transmit N input signals, the TDMA system slices a transmission period into N time slots with equal length, and each time slot is responsible for transmitting one of the N input signals. Thus, a communication link can simultaneously transmit N input signals. For example, a TDMA frame 200 is sliced into N time slots respectively corresponding to the analog input signals $A_1' \sim A_N'$, wherein time slots 202, 204, 206, 208, and 210 respectively transmit a portion of the analog input signals $A_1', A_2', A_{N-2}', A_{N-1}',$ and $A_N'$.

The TDMA modulator 104 includes a commutator 114 and a pulse width modulator 124. The pulse width modulator 124 generates pulse waves with pulse widths respectively proportional to the amplitudes of the analog input signals $A_1' \sim A_N'$. The commutator 114 respectively inserts one of the pulse waves generated by the pulse width modulator 124 into corresponding time slots of the TDMA signal $T_1$. The analog-to-digital converter 106 then converts the TDMA signal $T_1$ from analog to digital to obtain a digital TDMA signal $T_2$. The sampling rate of the analog-to-digital converter 106 is at least N times the sampling frequency of the pulse width modulator 124. The digital TDMA signal $T_2$ is then delivered to a TDMA demodulator 108. The TDMA demodulator 108 then demodulates the digital TDMA signal $T_2$ according to the TDMA method to obtain N digital signals $D_1' \sim D_N'$ respectively corresponding to the analog input signals $A_1' \sim A_N'$.

The TDMA demodulator 108 includes a de-commutator 118 and a pulse width demodulator 128. The de-commutator 118 respectively retrieves the digital samples corresponding to the analog input signals $A_1' \sim A_N'$ from the time slots of the digital TDMA signal T2 to obtain the N sample series respectively corresponding to the analog input signals $A_1' \sim A_N'$. The pulse width demodulator 128 then implements pulse width demodulation to demodulate the N sample series from high to low frequency to obtain digital signals $D_1' \sim D_N'$ respectively corresponding to the analog input signals $A_1' \sim A_N'$.

Output low pass filters 110A~110N then filter off high frequency noise generated in the demodulation process of the TDMA demodulator 108 from the digital signals $D_1' \sim D_N'$ to obtain the digital signals $D_1 \sim D_N$, wherein the digital signals $D_1 \sim D_N$ respectively correspond to one of the analog input signals $A_1 \sim A_N$. The output low pass filters 110A~110N are also referred to as "decimation filters" or "reconstruction filters".

In addition, the commutator 114 and the de-commutator 118 must be synchronized. Thus, the de-commutator 118 can correctly identify the samples inserted in the times slots of the TDMA signal $T_2$ by the commutator 114 and correctly retrieve the samples corresponding to the analog signals $A_1' \sim A_N'$ to precisely generate the sample series corresponding to the analog signals $A_1' \sim A_N'$. Otherwise, if the commutator 114 and the de-commutator 118 are not synchronized, the de-commutator 118 may erroneously put samples of a time slot corresponding to an ananlog signal $A_X'$ into sample series corresponding to an analog signal $A_Y'$. The synchronization can be achieved by a synchronization module independent of the TDMA modulator 104 and the TDMA demodulator 108. Moreover, modulation implemented by the pulse width modulator 124 and demodulation implemented by the pulse width demodulator 128 must also be synchronized.

FIG. 3 is a block diagram of a portion of a codec 300 according to the invention, wherein the codec 300 simultaneously converts multiple input signals from analog to digital with an analog-to-digital converter 306 according to a FDMA method. The codec 300 receives multiple analog input signals $A_1 \sim A_N$, and the codec 300 must convert the analog input signals $A_1 \sim A_N$ from analog to digital before the input signals are further processed. The input signals $A_1 \sim A_N$ may be analog audio signals, such as multi-channel audio signals, or analog video signals, such as three video inputs of RGB format.

Input low pass filters 302A~302N first respectively filter off high frequency noise from the analog input signals $A_1 \sim A_N$ to obtain analog input signals $A_1' \sim A_N'$, fitting the frequency band of the analog input signals $A_1' \sim A_N'$ to the range derived from the sampling rate of the analog-to-digital converter 306 according to Shannon-Nyquist sampling theorem and avoiding signal distortion due to inter-symbol interference. Thus, the input low pass filters 302A~302N are also referred to as "anti-alias filters". The filtered analog input signals $A_1' \sim A_N'$ are then delivered to a FDMA modulator 304. The FDMA modulator 304 modulates the analog input signals $A_1' \sim A_N'$ according to a FDMA method to an analog FDMA signal $F_1$.

If a FDMA system must simultaneously transmit N input signals, the FDMA system modulates the N input signals with N carriers of different frequencies to obtain N modulated signals and then mixes the N modulated signals to obtain a single FDMA signal. Thus, N input signals can be transmitted with the same communication link. A frequency synthesizer 312 of FIG. 3 first generates N carriers of different frequencies. The FDMA modulator 304 then modulates the input analog signals $A_1' \sim A_N'$ with the N carriers generated by the frequency synthesizer 312 to obtain N modulated signals. The FDMA modulator 304 further comprises a mixer and a band pass filter. The mixer mixes the N modulated signals to obtain a single mixed signal, and the band pass filter filters the mixed signal to eliminate noise. Finally, an analog FDMA signal $F_1$ is generated by the FDMA modulator 304.

The analog-to-digital converter 306 then converts the FDMA signal $F_1$ from analog to digital to obtain a digital FDMA signal $F_2$. The digital FDMA signal $F_2$ is then delivered to a FDMA demodulator 308. The FDMA demodulator 308 then demodulates the digital FDMA signal $F_2$ with the carriers generated by the frequency synthesizer 312 to obtain N digital signals $D_1' \sim D_N'$ respectively corresponding to the analog input signals $A_1' \sim A_N'$.

Output low pass filters 310A~310N then filter off high frequency noise generated in the demodulation process of the FDMA demodulator 308 from the digital signals $D_1' \sim D_N'$ to obtain the digital signals $D_1 \sim D_N$, wherein the digital signals $D_1 \sim D_N$ respectively correspond to one of the analog input signals $A_1 \sim A_N$. The output low pass filters 310A~310N are also referred to as "decimation filters" or "reconstruction filters".

In addition, the FDMA modulator 304 and the FDMA demodulator 308 must be synchronized, such that demodulator 308 can correctly demodulate the FDMA signal $F_2$ with adequate carriers to precisely generate the digital signals $D_1' \sim D_N'$ corresponding to the analog signals $A_1' \sim A_N'$. The synchronization can be achieved by a synchronization module independent of the FDMA modulator 304 and the FDMA demodulator 308.

FIG. 4 is a block diagram of a portion of a codec 400 according to the invention, wherein the codec 400 simultaneously converts multiple input signals from analog to digital with an analog-to-digital converter 406 according to a CDMA method. The codec 400 receives multiple analog input signals $A_1 \sim A_N$, and the codec 400 must convert the analog input signals $A_1 \sim A_N$ from analog to digital before the input signals are further processed. The input signals $A_1 \sim A_N$ may be analog audio signals, such as multi-channel audio signals, or analog video signals, such as three video inputs of RGB format.

Input low pass filters 402A~402N first respectively filter off high frequency noise from the analog input signals $A_1 \sim A_N$ to obtain analog input signals $A_1' \sim A_N'$, fitting the frequency band of the analog input signals $A_1' \sim A_N'$ to the range derived from the sampling rate of the analog-to-digital converter 406 according to Shannon-Nyquist sampling theorem and avoiding signal distortion due to inter-symbol interference. Thus, the input low pass filters 402A~402N are also referred to as "anti-alias filters". The filtered analog input signals $A_1' \sim A_N'$ are then delivered to a CDMA modulator 404. The CDMA modulator 404 modulates the analog input signals $A_1' \sim A_N'$ according to a CDMA method to an analog CDMA signal $C_1$.

If a CDMA system must simultaneously transmit N input signals, a CDMA modulator modulates the N input signals with different CDMA codes to obtain a single CDMA signal carrying the N input signals. Thus, N input signals can be transmitted with the same communication link. After a receiver receives the CDMA signal through the communication link, a CDMA demodulator demodulates the CDMA signal with the CDMA codes identical to those used by the CDMA modulator to recover the N input signals. The code generator 412 of FIG. 4 first generates different CDMA codes. The CDMA modulator 404 then modulates the input analog signals $A_1' \sim A_N'$ with the CDMA codes generated by the code generator 412 to obtain a single CDMA signal $C_1$.

The analog-to-digital converter 406 then converts the CDMA signal $C_1$ from analog to digital to obtain a digital CDMA signal $C_2$. The digital CDMA signal $C_2$ is then delivered to a CDMA demodulator 408. The CDMA demodulator 408 then demodulates the digital CDMA signal $C_2$ with the codes generated by the code generator 412 to obtain N digital signals $D_1' \sim D_N'$ respectively corresponding to the analog input signals $A_1' \sim A_N'$.

Output low pass filters 410A~410N then filter off high frequency noise generated in the demodulation process of the CDMA demodulator 408 from the digital signals $D_1' \sim D_N'$ to obtain the digital signals $D_1 \sim D_N$, respectively corresponding to one of the analog input signals $A_1 \sim A_N$. The output low pass filters 410A~410N are also referred to as "decimation filters" or "reconstruction filters".

In addition, the CDMA modulator 404 and the CDMA demodulator 408 must be synchronized. Thus, the CDMA demodulator 408 can correctly demodulate the CDMA signal $C_2$ with the same CDMA codes as the CDMA modulator 404 to precisely generate the digital signals $D_1' \sim D_N'$ corresponding to the analog signals $A_1' \sim A_N'$. The synchronization can be achieved by a synchronization module independent of the CDMA modulator 404 and the CDMA demodulator 408.

The invention adopts a multiple access modulation method to decrease the number of analog-to-digital converters required by a codec which must simultaneously process multiple analog video or audio signals. Three embodiments respectively corresponding to a TDMA method, a FDMA method, and a CDMA method are provided. Reducing the number of required analog-to-digital converters further reduces the chip area occupied by the analog-to-digital converter, reducing cost of the codec chip. In addition, because multiple access modulation of analog input signals and multiple access demodulation of a multiple access modulated signal is synchronized in the codec, the digital signals generated in the multiple access demodulation are synchronized to reduce signal distortion due to asynchronicity between the digital signals, such as ghost shadows or ripples of video signals.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A coder-decoder, simultaneously processing a plurality of first analog signals with only one analog-to-digital converter, comprising:
    a multiple access modulator, combining the first analog signals to obtain a first multiple access signal comprising the first analog signals;
    the analog-to-digital converter, coupled to the multiple access modulator, converting the first multiple access signal from analog to digital to obtain a second multiple access signal; and
    a multiple access demodulator, coupled to the analog-to-digital converter, separating the second multiple access signal to obtain a plurality of first digital signals respectively corresponding to the first analog signals.

2. The coder-decoder as claimed in claim 1, wherein the coder-decoder further comprises:
    a plurality of input low pass filters, coupled to input terminals of the multiple access modulator, filtering off high frequency noise from a plurality of second analog signals to obtain the first analog signals to avoid signal distortion due to inter-symbol interference; and
    a plurality of output low pass filters, coupled to output terminals of the multiple access demodulator, filtering off high frequency noise generated by the multiple access demodulator from the first digital signals to obtain a plurality of second digital signals;
    wherein the second digital signals respectively correspond to the first analog signals.

3. The coder-decoder as claimed in claim 1, wherein the multiple access modulator is a TDMA modulator, the multiple access demodulator is a TDMA demodulator, the first multiple access signal is a first TDMA signal, and the second multiple access signal is a second TDMA signal.

4. The coder-decoder as claimed in claim 3, wherein the TDMA modulator comprises:
    a pulse width modulator, coupled to the input low pass filters, generating a plurality of pulse waves with pulse widths respectively in proportion to the amplitudes of the first analog signals; and
    a commutator, coupled to the pulse width modulator, repeatedly capturing one of the pulse waves as a segment of the first TDMA signal during TDMA time slots respectively corresponding to the pulse waves, thus generating the first TDMA signal.

5. The coder-decoder as claimed in claim 4, wherein the TDMA time slots are equal in length and respectively correspond to one of the first analog signals.

6. The coder-decoder as claimed in claim 4, wherein the TDMA demodulator comprises:
   a de-commutator, coupled to the analog-to-digital converter, respectively retrieving samples contained in the TDMA time slots corresponding to the pulse waves from the second TDMA signal to obtain a plurality of sample series respectively corresponding to one of the first analog signals; and
   a pulse width demodulator, coupled to the de-commutator, demodulating the sample series to obtain the first digital signals corresponding to the first analog signals.

7. The coder-decoder as claimed in claim 1, wherein the multiple access modulator is a FDMA modulator, the multiple access demodulator is a FDMA demodulator, the first multiple access signal is a first FDMA signal, and the second multiple access signal is a second FDMA signal.

8. The coder-decoder as claimed in claim 7, wherein the coder-decoder further comprises a frequency synthesizer, coupled to the FDMA modulator and the FDMA demodulator, generating a plurality of carrier waves of different frequencies, and the FDMA modulator modulates the first analog signals with the carrier waves to obtain the first FDMA signal.

9. The coder-decoder as claimed in claim 8, wherein the FDMA modulator comprises:
   a mixer, mixing the carrier waves respectively carrying one of the first analog signals to obtain a mixed signal; and
   a band pass filter, coupled to the mixer, eliminating noise from the mixed signal to obtain the first TFMA signal.

10. The coder-decoder as claimed in claim 1, wherein the multiple access modulator is a CDMA modulator, the multiple access demodulator is a CDMA demodulator, the first multiple access signal is a first CDMA signal, and the second multiple access signal is a second CDMA signal.

11. The coder-decoder as claimed in claim 10, wherein the coder-decoder further comprises an orthogonal code generator, coupled to the CDMA modulator and the CDMA demodulator, generating a CDMA code signal, and the CDMA modulator modulates the first analog signals with the CDMA code signal to obtain the first CDMA signal.

12. The coder-decoder as claimed in claim 1, wherein the coder-decoder further comprises a synchronization module, coupled to the multiple access modulator and the multiple access demodulator, synchronizing the multiple access modulator and the multiple access demodulator, thus, the multiple access demodulator correctly identifies which samples of the second multiple access signal correspond to one of the first analog signals.

13. The coder-decoder as claimed in claim 1, wherein the first analog signals are video signals or audio signals.

14. A method for simultaneously processing a plurality of analog signals with only one analog-to-digital converter, comprising:
   modulating a plurality of first analog signals according to a multiple access method to obtain a first multiple access signal comprising the first analog signals;
   converting the first multiple access signal from analog to digital with the analog-to-digital converter to obtain a second multiple access signal; and
   demodulating the second multiple access signal according to the multiple access method to obtain a plurality of first digital signals respectively corresponding to the first analog signals.

15. The method as claimed in claim 14, wherein the method further comprises:
   filtering off high frequency noise from a plurality of second analog signals to obtain the first analog signals to avoid signal distortion due to inter-symbol interference; and
   filtering off high frequency noise generated in multiple access demodulation from the first digital signals to obtain a plurality of second digital signals;
   wherein the second digital signals respectively correspond to the first analog signals.

16. The method as claimed in claim 14, wherein the multiple access method is a time division multiple access (TDMA) method, the first multiple access signal is a first TDMA signal, and the second multiple access signal is a second TDMA signal.

17. The method as claimed in claim 14, wherein the multiple access method is a frequency division multiple access (FDMA) method, the first multiple access signal is a first FDMA signal, and the second multiple access signal is a second FDMA signal.

18. The method as claimed in claim 14, wherein the multiple access method is a code division multiple access (CDMA) method, the first multiple access signal is a first CDMA signal, and the second multiple access signal is a second CDMA signal.

19. The method as claimed in claim 14, wherein the method further comprises synchronizing the modulation of the first analog signals and the demodulation of the second multiple access signal, such that samples of the second multiple access signal corresponding to one of the first analog signals are correctly identified.

20. The method as claimed in claim 14, wherein the first analog signals are video signals or audio signals.

* * * * *